(12) United States Patent
Park et al.

(10) Patent No.: US 8,294,989 B2
(45) Date of Patent: Oct. 23, 2012

(54) APPARATUS AND METHOD FOR CREATING A PHOTONIC DENSELY-ACCUMULATED RAY-POINT

(75) Inventors: Yeonjoon Park, Yorktown, VA (US); Sang H. Choi, Poquoson, VA (US); Glen C. King, Williamsburg, VA (US); James R. Elliott, Versuvius, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 634 days.

(21) Appl. No.: 12/512,344

(22) Filed: Jul. 30, 2009

(65) Prior Publication Data

US 2011/0024609 A1 Feb. 3, 2011

(51) Int. Cl.
*G02B 27/44* (2006.01)
(52) U.S. Cl. ...................................................... 359/565
(58) Field of Classification Search .................. 359/350, 359/354, 355, 359, 360, 565, 573, 721; 356/305, 356/328, 334, 451, 456; 250/550
See application file for complete search history.

(56) References Cited

U.S. PATENT DOCUMENTS

| | | | |
|---|---|---|---|
| 3,107,270 A | 10/1963 | Hildesbrand | |
| 4,752,130 A | 6/1988 | George et al. | |
| 4,995,714 A | 2/1991 | Cohen | |
| 6,518,555 B1 | 2/2003 | Kikuchi et al. | |
| 6,762,839 B2 | 7/2004 | Zeylikovich et al. | |
| 6,999,165 B2 | 2/2006 | Hagler | |
| 7,072,442 B1 | 7/2006 | Janik | |
| 7,158,228 B2 | 1/2007 | Psaltis et al. | |
| 7,196,791 B2 | 3/2007 | Johansen et al. | |
| 8,018,815 B2 | 9/2011 | Choi et al. | |
| 2001/0046276 A1 | 11/2001 | Schneider et al. | |
| 2007/0109924 A1 | 5/2007 | Takahashi et al. | |
| 2007/0139777 A1* | 6/2007 | Williams et al. | 359/565 |
| 2007/0164842 A1 | 7/2007 | Koenig | |
| 2009/0231677 A1 | 9/2009 | Park et al. | |
| 2009/0261250 A1* | 10/2009 | Zhou et al. | 250/307 |

OTHER PUBLICATIONS

Fu et al., Plasmonic microzone plate: Superfocusing at visible regime, Applied Physics Letters 91, 061124 (2007).*
Raymond A. Serway, Physics for Scientists & Engineers, 4th Ed., vol. 2 (1996), p. 1065.*

(Continued)

*Primary Examiner* — Stephone Allen
*Assistant Examiner* — Kimberly N Kakalec
(74) *Attorney, Agent, or Firm* — Andrea Z. Warmbier; Linda B. Blackburn

(57) ABSTRACT

An optical apparatus includes an optical diffraction device configured for diffracting a predetermined wavelength of incident light onto adjacent optical focal points, and a photon detector for detecting a spectral characteristic of the predetermined wavelength. One of the optical focal points is a constructive interference point and the other optical focal point is a destructive interference point. The diffraction device, which may be a micro-zone plate (MZP) of micro-ring gratings or an optical lens, generates a constructive ray point using phase-contrasting of the destructive interference point. The ray point is located between adjacent optical focal points. A method of generating a densely-accumulated ray point includes directing incident light onto the optical diffraction device, diffracting the selected wavelength onto the constructive interference focal point and the destructive interference focal point, and generating the densely-accumulated ray point in a narrow region.

19 Claims, 5 Drawing Sheets

OTHER PUBLICATIONS

Surface plasmon polaritons, (Wikipedia), [online], [retrieved on Apr. 3, 2012] Retrieved from the Internet: <URL: http://en.wikipedia.org/wiki/Surface_plasmon_polaritons>.*

D. Gill et al., Lithographic patterning and confocal imaging with zone plates, J. Vac. Sci. Technol. B, 2000, p. 2881-2898, vol. 18(6).

Ihsan J. Djomehri et al., Zone-plate-array lithography in the deep ultraviolet, J. Vac. Sci. Technol. B, 1998, p. 3426-3429, vol. 16.

Rajesh Menon et al., Alpha-prototype system for zone-plate-array lithography, J. Vac. Sci. Technol. B, 2004, p. 3032-3037, vol. 22.

* cited by examiner

APPARATUS AND METHOD FOR CREATING A PHOTONIC DENSELY-ACCUMULATED RAY-POINT

The invention described herein was made by employees of the United States Government and may be manufactured and used by or for the Government for governmental purposes without payment of any royalties thereon or therefor.

TECHNICAL FIELD

The present invention relates generally to an optical method and apparatus for generating a highly-focused or densely-accumulated ray point of incident light surrounded by destructive interference rings.

BACKGROUND OF THE INVENTION

The process of lithography involves the transfer of a pattern to photosensitive material using light or another suitable radiation source. That is, when photosensitive material is exposed to radiation while regions of the material are masked, the radiation pattern is transferred to the exposed or unmasked material due to the difference in the properties of the exposed and unexposed regions. In this manner various lithographic products may be produced. Certain laser lithography or photolithography processes use a laser beam having a narrow beam width as the radiation in order to imprint precise patterns onto a substrate.

Focusing a laser beam using conventional optical lenses may be limited by the achievable beam-waist of a Gaussian photon profile. That is, one must decrease the focal distance of a conventional optical lens in order to achieve a finely-focused diameter. Focusing light into a beam having a diameter less than the wavelength of the photons may be extraordinarily difficult to achieve. Phase-contrast (PC) lithography processes that use PC masking techniques may enhance the available optical resolution. However, PC masking is known to be relatively expensive, with a different PC mask typically being fabricated for each required lithography pattern.

SUMMARY OF THE INVENTION

Accordingly, a photonic densely-accumulated ray-point (DART) method and apparatus are provided herein for generating a strong constructive spot or ray point using a phase-contrast mechanism of the destructive rings of a destructive focal point. A single, finely-focused non-conventional optical point is created by destructive interference between adjacent conventional focal points. Such a point may enable ultra-high resolution optical lithography without the need for phase-contrast (PC) masking of the type explained above.

Using the DART method, photons of incident light may be focused into an ultra-narrow region below the wavelength of the photons using a suitable diffraction device, e.g., a conventional micro-ring grating (μRG) assembly, an electro-optical μRG assembly, optical lenses, or another suitable optical device generating the required phase-contrast effect. For example, a ray point having a full-width-half-maximum (FWHM) value of 465 nm may be used with a laser beam having a diameter of 532 nm, thus enabling power densities on the order of at least a few MW/cm² at the focused ray point. Such extremely high-power densities may be harnessed for various useful optical system designs.

In particular, an optical apparatus includes an optical diffraction device configured for diffracting a predetermined wavelength of incident light onto adjacent optical focal points, wherein one of the optical focal points is a constructive interference point and the other optical focal point is a destructive interference point. The apparatus may include a photon detector operable for detecting a spectral characteristic of the predetermined wavelength. The diffraction device is adapted for generating a constructive ray point using phase-contrasting of the destructive interference point, with the ray point being located between the adjacent optical focal points.

The optical diffraction device may include coaxially-aligned micro-ring gratings, and may include an electro-optical layer positioned adjacently thereto. The phase-contrasting effect may be achieved at least in part by selectively applying a voltage to the electro-optical layer. Alternately, the optical diffraction device may include a concave lens or a convex lens.

A method of generating a densely-accumulated ray point using an optical diffraction device includes directing incident light onto the optical diffraction device, with the optical diffraction device configured for diffracting a selected wavelength of the incident light onto a constructive interference focal point and a destructive interference focal point. The destructive interference focal point has a series of concentric destructive rings. The method also includes diffracting the selected wavelength onto the constructive interference focal point and the destructive interference focal point using the optical diffraction device, and phase-contrasting the concentric destructive rings using the MZP to thereby generate the ray point. The method may include detecting spectral characteristics of the selected wavelength using a photon detector or other suitable device. The method may also include using the ray point for sub-wavelength optical lithography, nano-fabrication, or optical manipulation of molecules.

The above features and advantages and other features and advantages of the present invention are readily apparent from the following detailed description of the best modes for carrying out the invention when taken in connection with the accompanying drawings.

DESCRIPTION OF THE PREFERRED EMBODIMENTS

Figure 1:
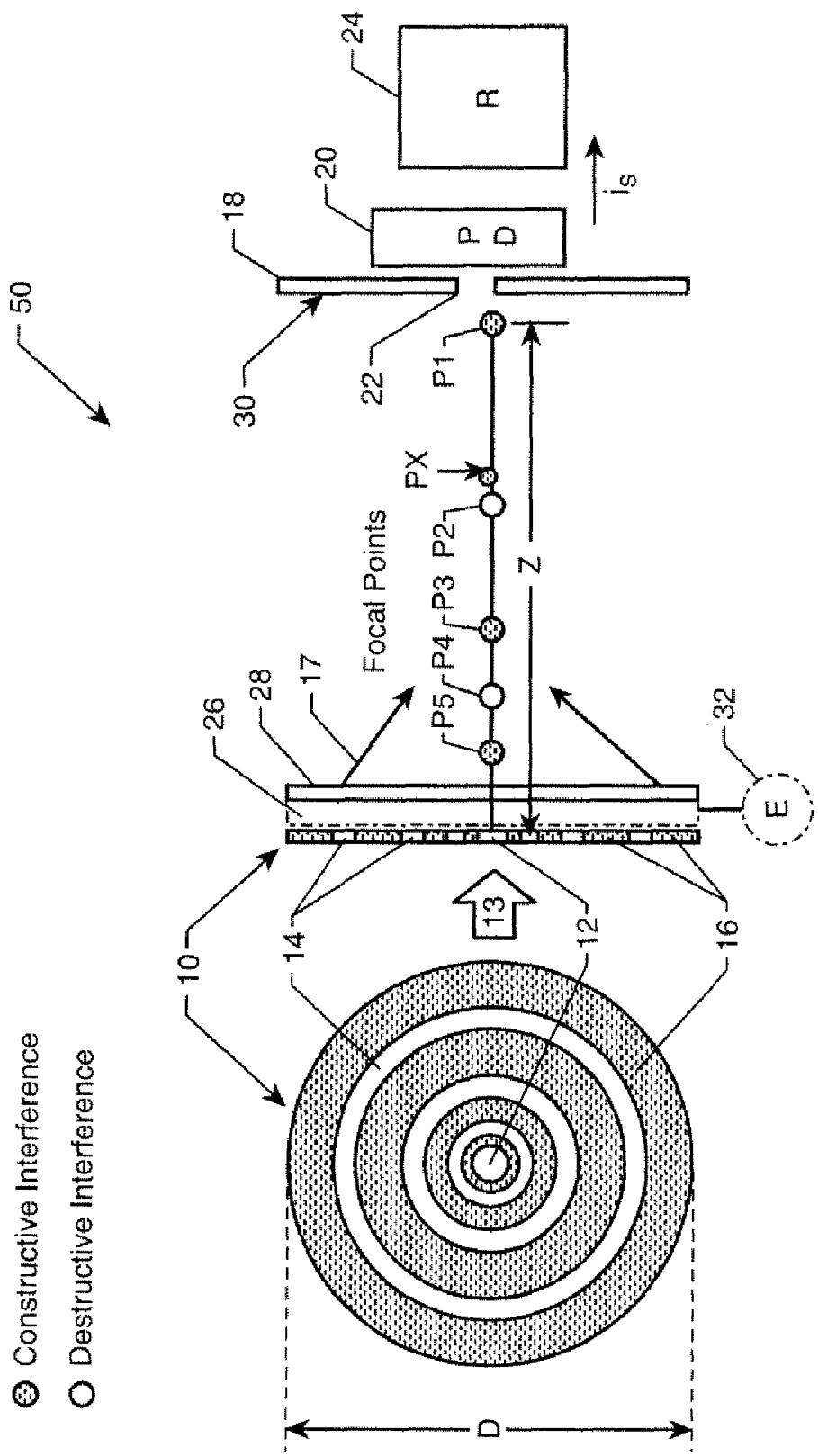
FIG. 1 is a schematic illustration of a micro-zone plate (MZP) system configured for generating a non-conventional densely-accumulated ray point in accordance with one embodiment of the present invention.

Referring to the drawings wherein like reference numbers represent like components throughout the several figures, and beginning with FIG. 1, a micro-zone plate (MZP) 10 is shown in both front and side-view that may be used to generate a non-conventional densely-accumulated ray point (PX) between successive conventional focal points. The ray point (PX) is focused using phase contrasting, as will be explained below. Within the scope of the present invention, the term "MZP" refers to a plate or film of alternating transparent and opaque concentric rings of a predetermined or calibrated width. The MZP 10 may be constructed on a thin film or layer of glass or other suitable material, as is understood in the art. The MZP 10 can acquire photons of a particular wavelength from multiple point light sources or micro/nano objects, and can focus the photons at the ray point (PX) within an ultra-narrow region below the wavelength of the photons, e.g., a 532 nm laser beam.

The MZP 10 includes a transparent center disk 12 that is circumscribed by a series of progressively larger transparent rings 14. The transparent rings 14 are separated by an interposed series of progressively larger opaque rings 16, with the center disk 12 and each of the rings being coaxially-aligned and centered on a common optical axis 11. For simplicity, the number of rings 14, 16 is kept at a minimum in FIG. 1, with the actual number of rings depending on the particular design and intended use of the MZP 10.

The transparent center disk 12 and the various rings 14, 16 may be configured as optical gratings on a thin film of glass or other suitable material. As will be understood by those of ordinary skill in the art, the term "optical gratings" refers to an optical element configured for diffracting incident light and directing it to a predetermined optical focal point. Gratings have a regular pattern which split and diffract incident light into several beams travelling in directions that depend on the spacing between gratings and the wavelength of the incident light.

Still referring to FIG. 1, source light (arrows 13) is directed toward the MZP 10 from a light source, e.g., a micro/nano object, organism, matter, or other substance serving as the subject of the spectral analysis at hand. The source light is then diffracted by the various rings 14, 16 of the MZP 10 into different wavelengths, with each wavelength directed toward a conventional constructive or destructive optical focal point P1, P2, P3, P4, or P5. That is, the focal point corresponds to particular wavelengths or frequencies of the source light (arrows 13). The transparent center disk 12 allows a constructive interference point at the farthest focal point, i.e., the focal point P1. Additional constructive interference points are provided at focal points P3 and P5.

As is well understood in the art, the transmission of light in the form of waves gives rise to the principals of constructive and destructive wave interference. During any wave interference the shape of the medium is determined by the sum of the separate amplitudes of each wave. The waves interfere when one wave passes through another. When the crest of one wave is superpositioned upon the crest of another, the waves constructively interfere. Constructive interference also occurs when the trough of one wave is superpositioned upon the trough of another. Conversely, destructive interference occurs when the crest of one wave is superpositioned upon the trough of another. During destructive interference, the positive amplitudes from one crest are added to the negative amplitudes from the other trough, with the result being a reduced amplitude or destructive wave interference. Such principles give rise to the different constructive/destructive focal points discussed above.

The ray point PX provides a strong intermediate constructive spot, which is surrounded by destructive rings (see FIG. 4B) at a point between conventional focal points P1 and P2, and closely adjacent to the destructive interference focal point P2. The MZP 10 has a diameter on the micro-scale. In one embodiment the diameter (D) is approximately 20 micrometers or microns ($\mu$) to approximately 30$\mu$, while in another embodiment the diameter (D) is approximately 22$\mu$ with a transparent center disk 12 of approximately 7$\mu$. However, other diameters of the MZP 10 and its center disk 12 may be used without departing from the intended scope of the invention. In the embodiment wherein the diameter (D) is approximately 22$\mu$ and the center disk 12 is approximately 7$\mu$, the focal length (Z) between the conventional focal points P1-P5 and the MZP 10 may be theoretically calculated as: 46.99$\mu$, 15.66$\mu$, 9.40$\mu$, 6.71$\mu$, and 5.22$\mu$, respectively.

Still referring to FIG. 1, a densely-accumulated ray point (DART) apparatus 50 may include the MZP 10, a light-blocking aperture device 18, and a photon detector (D) 20. The aperture device 18 defines an opening or aperture 22, which may be circular according to one embodiment, and which may be moved as needed to circumscribe a desired conventional focal point P1-P5 or the ray point PX. The DART apparatus 50 may be placed in communication with a data recorder 24, which may be any device configured for recording the desired spectral information (arrow $i_s$) detected, measured, or otherwise determined by the photon detector 20.

A light source (not shown) may be a naturally-existing light emitter, fluorescence, or emission spectra from excited molecules of target materials by an accompanying light-emitting diode (LED) or diode laser. The light source generate, emits, or radiates source radiation or source light (arrows 13), which is transmitted to the MZP 10. The source light (arrows 13) is differentiated by diffraction through the micro-ring pattern of the annular gratings or rings 14, 16 of the MZP 10, and optionally through an electro-optical (E/O) layer 26 positioned adjacent thereto, with diffracted light (arrows 17) passing from the micro-ring gratings of the MZP 10 through a transparent electrode layer 28 and to the aperture device 18.

The diffracted light (arrows 17) of a predetermined wavelength(s) is allowed to enter the aperture 22, while non-selected wavelength(s) are reflected away by a light-blocking surface 30. The electrode layer 28 may be constructed of indium Tin Oxide (ITO) or another suitable material providing a bias voltage for the E/O layer 26. The E/O layer 26 in turn may be constructed of a material having a refractive index that is varied by application of an electrical field, e.g., liquid crystal, non-linear optical crystal, or electro-optical polymer to name just a few. An energy source (E) 32 may be selectively connected to the E/O layer 26 and/or to the MZP 10 to generate the required electrical field in this particular embodiment.

Figure 2:
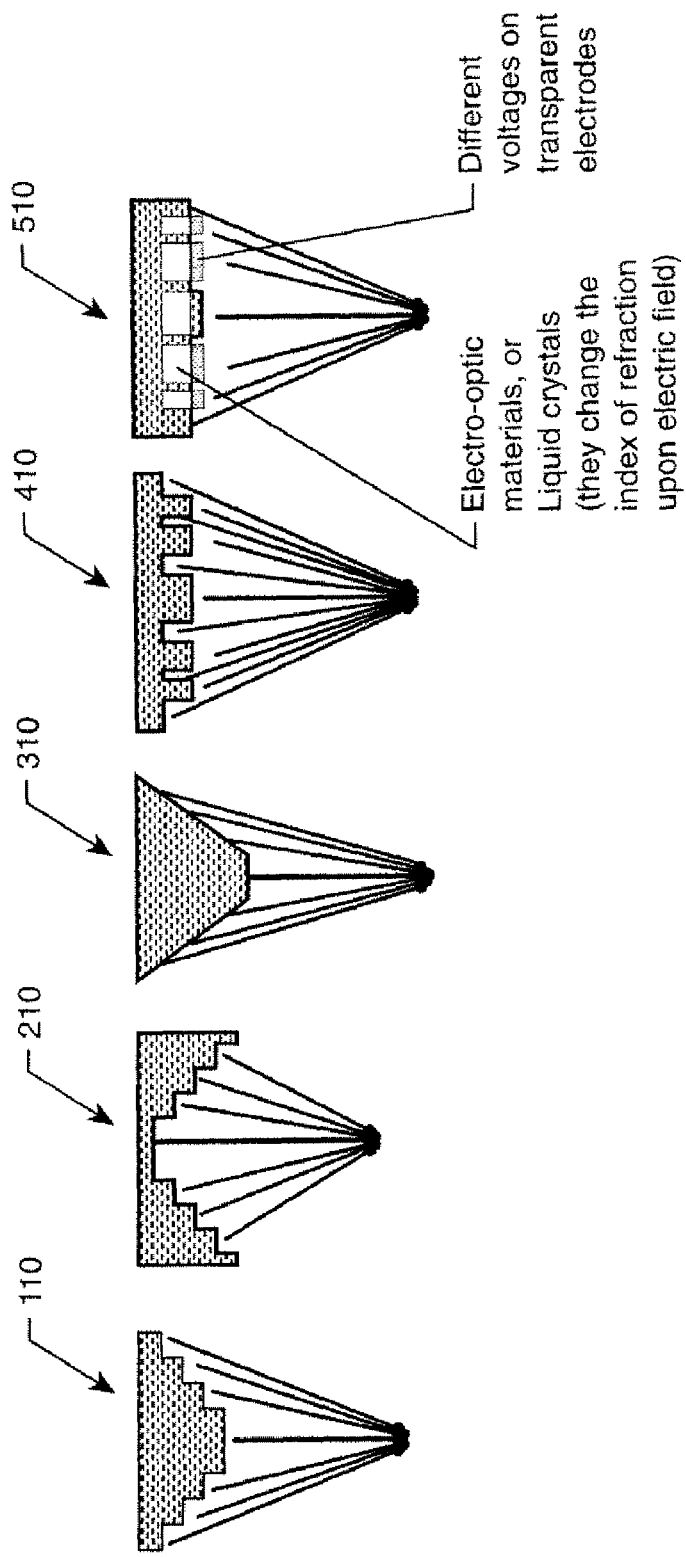
FIG. 2 is schematic illustration of an alternative set of optical devices each being suitable for generating the densely-accumulated ray point shown in FIG. 1.

Referring to FIG. 2, the ray point PX may be alternately achieved with optical lenses or devices other than the MZP 10 shown in FIG. 1 and described above. For example, phase-contrast around the central spot may be achieved using optical devices 110, 210, 310, 410, and 510. Optical devices 10 and 310 may be configured as a convex lens or prism, while optical device 210 may be a concave lens or prism. Optical device 410 may be configured as a conventional µRG device, e.g., the MZP 10 of FIG. 1, while optical device 510 may be configured as an electro-optical µRG device having an electrically-variable index of refraction, e.g., the E/O variant shown in phantom in FIG. 1 and discussed above. However configured, each of the optical devices 110-510 utilize phase contrasting to enhance and focus the center beam 34 generating the ray point PX, as will now be discussed in detail with reference to FIG. 3.

Figure 3:
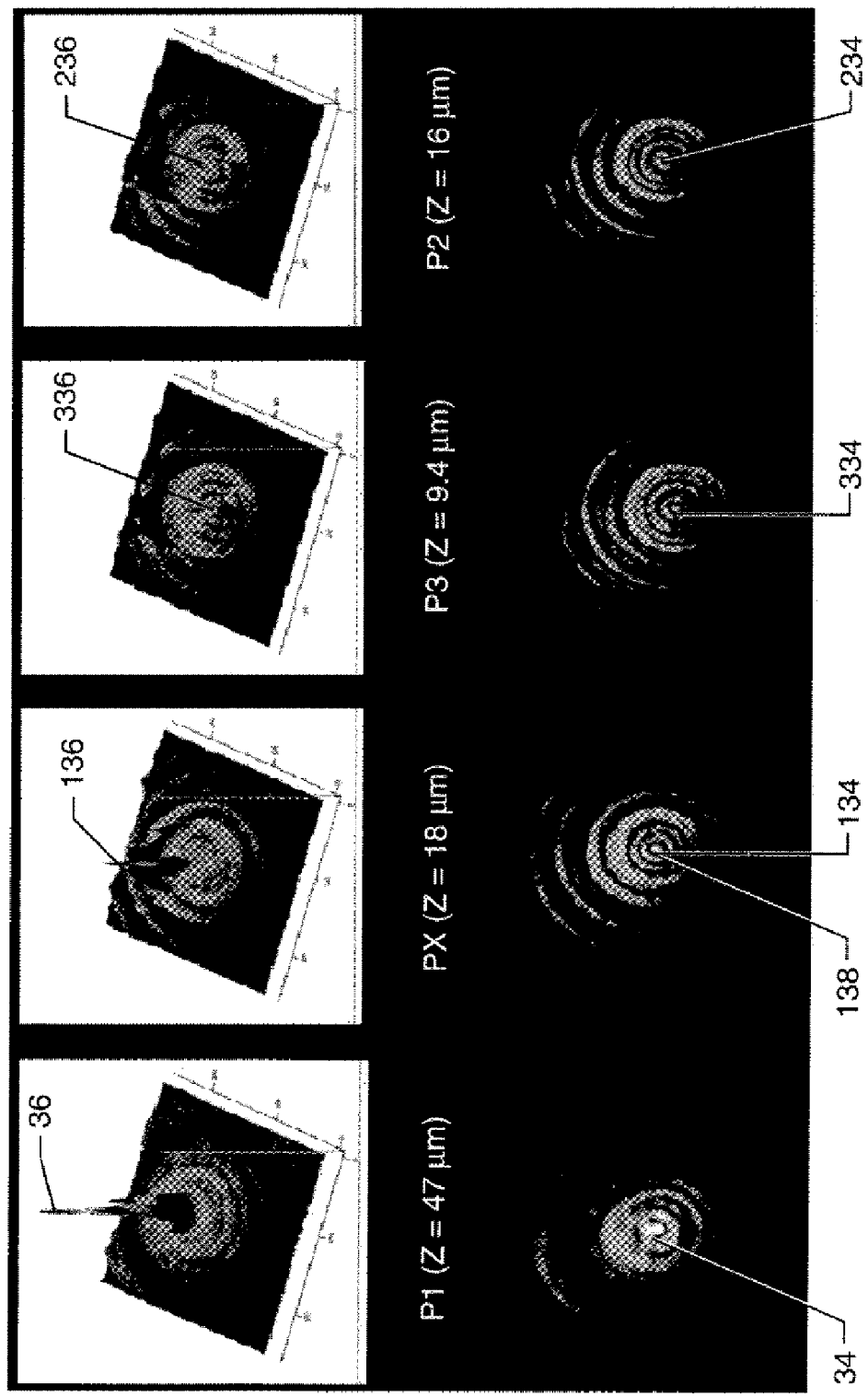
FIG. 3 is a schematic illustration of a series of photon measurement profiles describing certain attributes of the conventional focal points and the ray point shown in FIG. 1.

Referring to FIG. 3, measured photon distribution of a 532 nm laser is shown for focal point P1 at Z=47$\mu$, the ray point PX at Z=18$\mu$, and for focal points P2 at Z=16$\mu$ and P3 at Z=9.4$\mu$. Focal point P1 has the highest intensity of photons, with a brightly-focused point at its center 34. However, the distribution 36 of photons at the center 34 of focal point P1 is relatively low compared to the distribution 136 of photons at ray point PX. Note that the center 134 of ray point PX has a smaller diameter than that of the center 34 of focal point P1. Also, the center 234 of focal point P2 is almost devoid of photons, as shown by photon distribution 236. As observed herein, this effect is created by the collapsing of the destructive rings surrounding the bright center 134 at focal point PX. Also shown in FIG. 3 is focal point P3, which is a constructive spot with a relatively weak center 334, as shown also by the weak distribution 236, and with many distributed bright rings.

Full-Width-Half-Maximum (FWHM) of the focused center beams, i.e., centers 34, 134, 234, and 334, may be precisely measured using a charge-coupled device (CCD), e.g., a 5 mega-pixel CCD detector or another suitable detection and measurement device, and by adjusting the exposure time of the CCD. As will be understood by those of ordinary skill in the art, FWHM is used to describe a measurement of the width of an object when that object does not have sharp edges. The image has a profile which is approximated by a Gaussian curve, given mathematically by: $\exp(-x^2/2\sigma^2)$, with $\sigma$ being the Gaussian parameter. The width across the profile when it drops to half of its peak value is the full-width half-maximum.

To match the intensity peak height of focal point P1 and ray point PX, the CCD's exposure time may be increased for the measurement of focal point PX such that data at focal point P1 is obtained in a shorter scan period relative to that of focal point PX, e.g., a scan of approximately 4 ms for P1 versus a scan of approximately 6 ms for focal point PX.

In one embodiment, using a laser beam of 532 nm the FWHM at focal point P1 is approximately 620 nm, and approximately 465 nm at ray point PX. Note that the 465 nm FWHM of ray PX is less than the resolution of the 532 nm laser itself. Therefore, the highly-focused ray point PX may be generated between the conventional focal points P1 and P2, with a sharper and much more narrowly-focused beam profile than that of the conventional focal point P1.

The bright center 134 of ray point PX is surrounded by a dark destructive-interference ring 138. A phase-contrast phenomenon occurs near the center 134. The phase-contrast phenomenon has a sharpening effect on the center 134. In terms of the vertical distance on the optical axis 11 (see FIG. 1), the ray point PX is positioned close to the destructive focal point P2 (see FIG. 1), just 2μ in the embodiment shown in FIG. 3. Therefore the same destructive interference that acts at focal point P2 forms the surrounding dark interference ring 138 at ray point PX at a position just above or adjacent to focal point P2 and between focal points P1 and P2, as shown in FIG. 1. Tuning of the center 134 may be achieved by precise phase-contrasting of the destructive rings of focal point P2, e.g., using positioning of the MZP 10, tuning of the MZP 10 using its electro-optical variant, or any of the optical devices 110-510 of FIG. 2.

Figure 4:
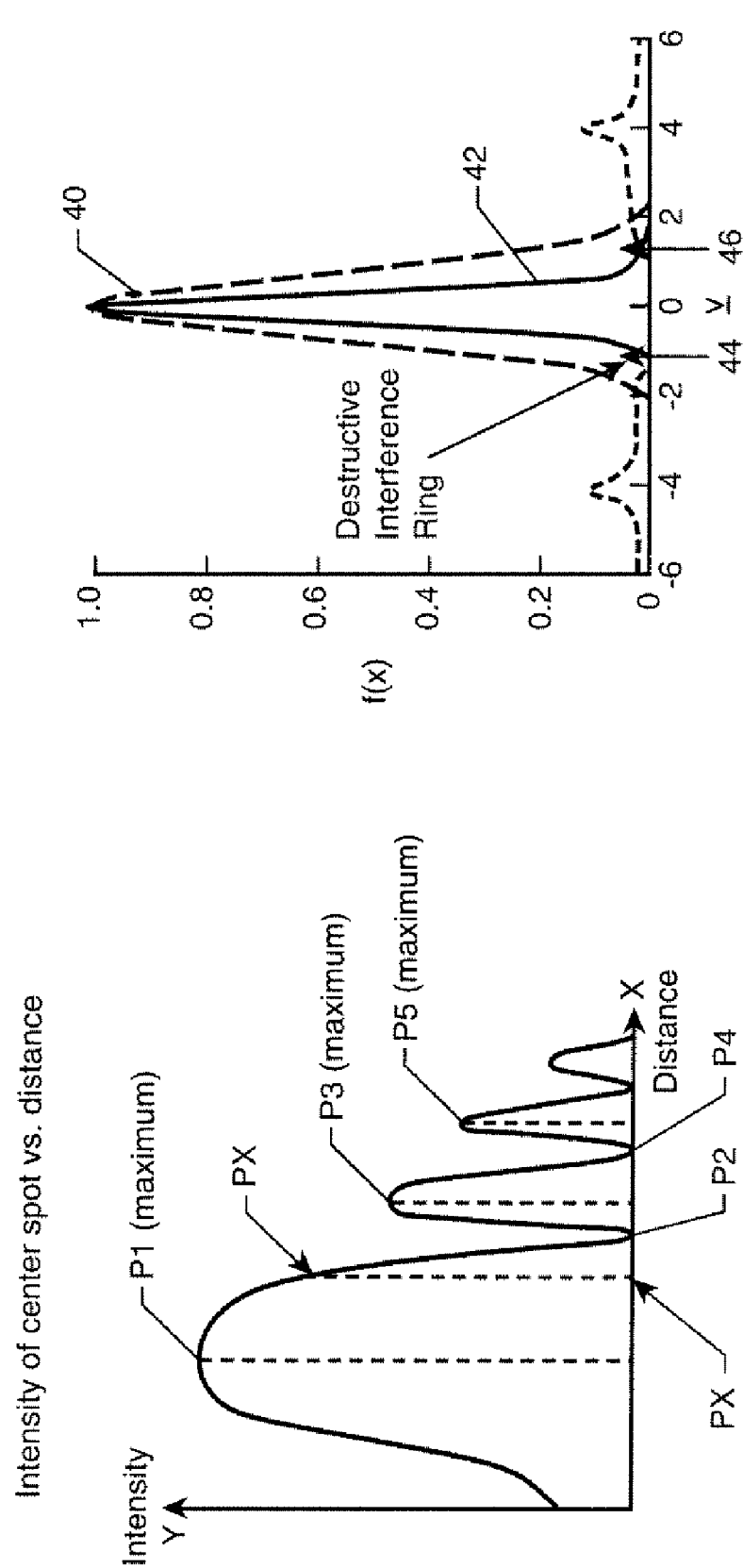
FIG. 4A is a graph of intensity versus distance of the photon measurements shown in FIG. 3.
FIG. 4B is a graph showing a destructive interference ring forming the densely-accumulated ray point shown in FIG. 1.

Referring to FIG. 4A, the conventional focal points P1-P5 and the non-conventional focal point or ray point PX are shown for the MXP 10 of FIG. 1. Note that ray point PX has a sharp FWHM, but it is not a conventional focal point as is P1, P2, etc. The conventional focal points P1-P5 of MZP 10 have an intensity (plotted on the Y-axis) that is measured at the center 34, 134, 234, 334 (see FIG. 3) on optical axis 11 (see FIG. 1). The x-axis in FIG. 4A is oriented toward the MZP 10 shown in FIG. 1, i.e., focal point P5 is closer to the plane of the MZP 10 than are points PX and P1.

The focal points P1-P5 have alternating maximum and minimum intensities such that focal points P1, P3, and P5 are the maxima and focal points P2 and P4 are the minima, as will be understood by those of ordinary skill in the art. The non-conventional photonic ray point PX is neither a conventional maximum nor minimum focal point, but rather an intermediate point formed between points P1 and P2 as noted above.

Referring to FIG. 4B, line 40 shows a conventional Gaussian distribution of photons at a representative focal point using a conventional lens. Line 42 shows the ultra-sharp distribution of photons at non-conventional ray point PX. Line 42 is surrounded by one or multiples of destructive interference rings 138 (see FIG. 3). The phase contrast effect shown at points 44 and 46 removes the tail of a Gaussian distribution of the central spot of ray point PX and minimizes the FWHM, i.e., sharpens the spot.

If a 10 mW laser having a 2 mm beam diameter, i.e., a density of 0.3 W/cm$^2$, is roughly focused on MZP 10 of FIG. 1, and the MZP 10 is used to focus 10% of these photons on ray point PX, the power density of the beam at ray point PX is approximately 10$^5$ W/cm$^2$. In another embodiment the power density is approximately 10$^3$ W/cm$^2$. Such extreme densities may be powerful enough to melt steel, for example, in a zone within the FWHM diameter. Therefore, the focusing of a beam at ray point PX brings the ultra-high power density required for many applications, including but not limited to optical data storage, sub-wavelength optical lithography, nano-fabrication, optical manipulation of molecules and nano-structures, etc.

Figure 5:
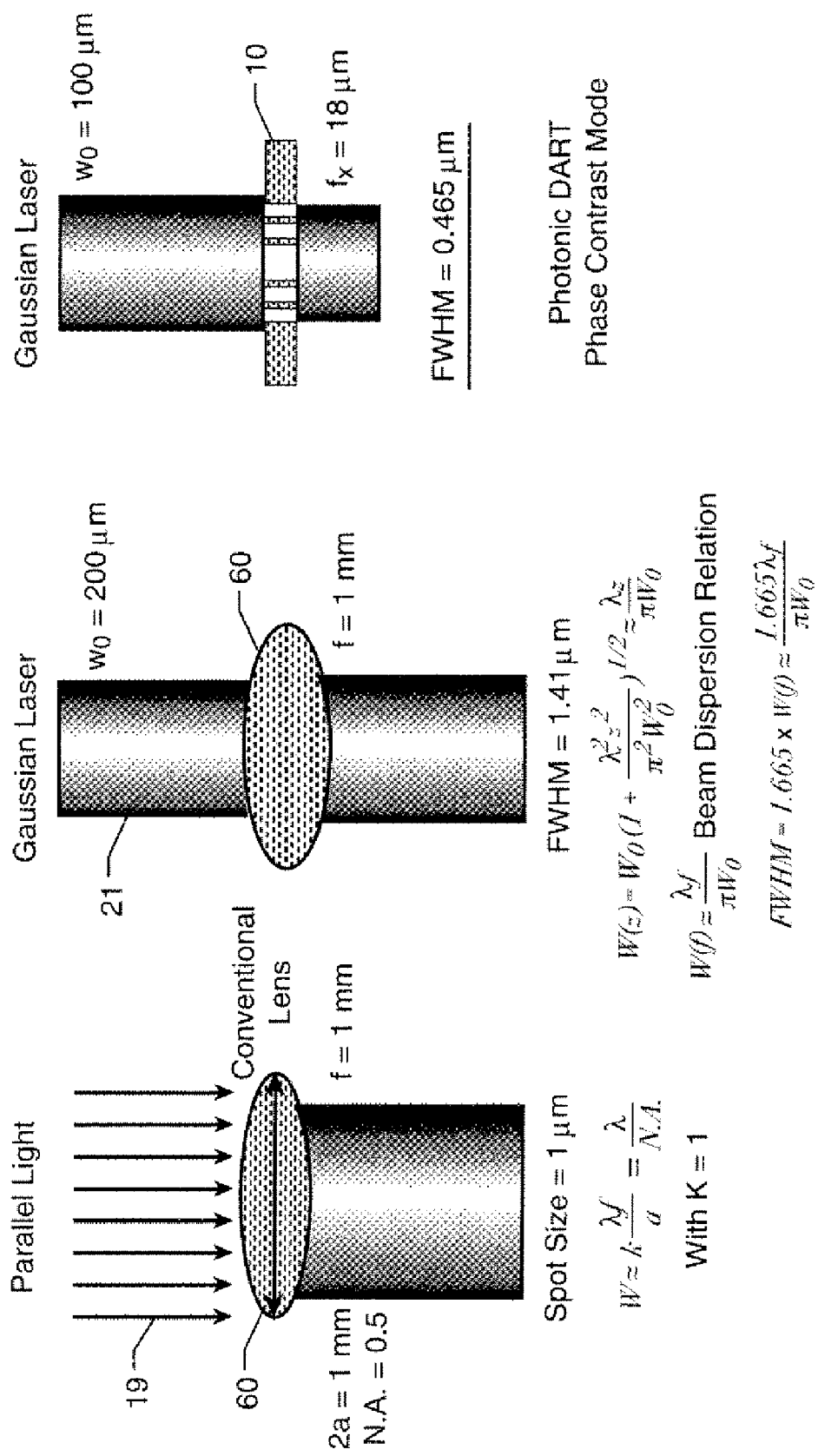
FIG. 5 is a schematic illustration of a conventional lens with parallel light, a Gaussian laser dispersion, and a phase-contrast mode using the method and apparatus of the present invention.

Referring to FIG. 5, a rough comparison may be made of different spot-sizes from a conventional lens 60 with parallel light (arrows 19), a Gaussian laser dispersion 21, and a phase-contrast mode using the method and apparatus described above, using the same green laser or parallel light with a 532 nm wavelength. The typical spot size of a conventional lens 60 with a parallel light may be described as:

$$W \approx k\frac{\lambda f}{a} = k\frac{\lambda}{N.A.}$$

where N.A. is the numerical aperture and k is a proportional factor that is dependent on the optic system design. In a fabricated micro-zone-plate such as the MZP 10 of FIG. 1, f=18 micrometers and a=10 micrometers. Therefore, the expected spot size is 957 nm with a conventional lens of k=1. A measured FWHM of the photon distribution of 465 nm means that its k value is approximately 0.5. Therefore, an ultra-sharply focused light at non-conventional ray point PX may be obtained between two successive focal points, e.g., P1 and P2, where one point (P1) is constructive and the other (P2) is destructive, using the MZP 10 of FIG. 1 or any of the optical devices 110-510 of FIG. 5.

While the best modes for carrying out the invention have been described in detail, those familiar with the art to which this invention relates will recognize various alternative designs and embodiments for practicing the invention within the scope of the appended claims.

The invention claimed is:

1. An optical apparatus comprising: an optical diffraction device configured for diffracting a predetermined wavelength of incident light onto adjacent optical focal points, wherein one of the optical focal points is a constructive interference point due to constructive interference between two light diffraction orders and the other optical focal point is a destructive interference point due to destructive interference between two light diffraction orders; and a photon detector operable for detecting a spectral characteristic of the predetermined wavelength; wherein the diffraction device is adapted for generating a constructive ray point using phase-contrasting of the destructive interference point, the ray point being located between the adjacent optical focal points.

2. The apparatus of claim 1, wherein the optical diffraction device includes a plurality of coaxially-aligned micro-ring gratings.

3. The apparatus of claim 2, further comprising an electro-optical layer positioned adjacently to the coaxially-aligned micro-ring gratings, wherein the phase-contrasting is achieved at least in part by selectively applying a voltage to the electro-optical layer.

4. The apparatus of claim 3, wherein the electro-optical layer is constructed of one of: a liquid crystal, a non-linear optical crystal, and an electro-optical polymer.

5. The apparatus of claim 1, wherein the ray point has a power density of at least approximately $10^3$ watt/cm$^2$.

6. The apparatus of claim 1, wherein the optical diffraction device includes one of a concave lens and a convex lens.

7. An optical apparatus comprising: a micro-zone plate (MZP) having a plurality of coaxially-aligned micro-ring gratings configured for diffracting a predetermined wavelength of incident light from a sample onto a constructive interference focal point and a destructive interference focal point, the destructive interference focal point having a series of concentric destructive rings; and a photon detector operable for measuring an intensity of the predetermined wavelength; wherein the constructive interference focal point is due to constructive interference between two light diffraction orders and the destructive interference focal point is due to destructive interference between two light diffraction orders; and wherein the apparatus is adapted for phase-contrasting the concentric destructive rings to generate a constructive ray point between the constructive interference focal point and the destructive interference focal point.

8. The apparatus of claim 7, wherein the MZP has a diameter of approximately 20 micrometers to approximately 30 micrometers, and has a transparent center disk having a diameter of approximately 5 microns to approximately 10 microns.

9. The apparatus of claim 8, wherein the MZP has a diameter of approximately 22 micrometers, and wherein the transparent center disk has a diameter of approximately 7 micrometers.

10. The apparatus of claim 7, wherein a first focal length between the MZP and the constructive interference focal point is approximately 46 micrometers to approximately 47 micrometers, and wherein a second focal length between the MZP and the destructive interference focal point is approximately 15 micrometers to approximately 16 micrometers.

11. The apparatus of claim 7, wherein the spacing between the destructive interference focal point and the constructive ray point is approximately 2 micrometers.

12. The apparatus of claim 7, wherein the wavelength of the incident light is greater than the diameter of the constructive ray point.

13. The apparatus of claim 7, wherein the focal length between the MZP and the constructive ray point is approximately 16 micrometers.

14. The apparatus of claim 7, further comprising an electro-optical layer, wherein the phase-contrasting is achieved at least in part by selectively applying a voltage to the electro-optical layer.

15. A method of generating a densely-accumulated ray point using an optical diffraction device, the method comprising: directing incident light onto the optical diffraction device, wherein the optical diffraction device is configured for diffracting a selected wavelength of the incident light onto a constructive interference focal point and a destructive interference focal point, the destructive interference focal point having a series of concentric destructive rings; diffracting the selected wavelength onto the constructive interference focal point and the destructive interference focal point using the optical diffraction device; phase-contrasting the concentric destructive rings using the optical diffraction device to thereby generate the ray point; and detecting a spectral characteristics of the selected wavelength using a photon detector; wherein the constructive interference focal point is due to constructive interference between two light diffraction orders and wherein the destructive interference focal point is due to destructive interference between two light diffraction orders.

16. The method of claim 15, wherein directing incident light onto the optical diffraction device includes directing a laser onto a micro-zone plate (MZP).

17. The method of claim 15, wherein the laser has a wavelength of approximately 532 nanometers, and wherein the MZP has a diameter of approximately 22 micrometers and a transparent center disk of approximately 7 micrometers.

18. The method of claim 15, including an electro-optical layer positioned adjacently to the MZP, wherein diffracting the selected wavelength includes generating an electrical field with respect to the MZP to thereby vary a refractive index of the electro-optical layer.

19. The method of claim 15, further comprising:
using the ray point in a process selected from the group consisting of: sub-wavelength optical lithography, nano-fabrication, and optical manipulation of molecules.

* * * * *